United States Patent
Kohno et al.

(10) Patent No.: US 10,504,698 B2
(45) Date of Patent: Dec. 10, 2019

(54) PLASMA PROCESSING APPARATUS

(71) Applicant: Tokyo Electron Limited, Tokyo (JP)

(72) Inventors: Masayuki Kohno, Austin, TX (US);
Ryou Son, Miyagi (JP); Naoki Matsumoto, Miyagi (JP); Jun Yoshikawa, Miyagi (JP); Michitaka Aita, Miyagi (JP); Ippei Shimizu, Miyagi (JP); Yusuke Yoshida, Miyagi (JP); Koji Koyama, Miyagi (JP); Masami Sudayama, Miyagi (JP); Yukiyoshi Aramaki, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 713 days.

(21) Appl. No.: 14/868,554

(22) Filed: Sep. 29, 2015

(65) Prior Publication Data
US 2016/0118224 A1    Apr. 28, 2016

(30) Foreign Application Priority Data
Oct. 27, 2014   (JP) ................................. 2014-218625

(51) Int. Cl.
*H01J 37/32* (2006.01)
(52) U.S. Cl.
CPC .. *H01J 37/32192* (2013.01); *H01J 37/32266* (2013.01); *H01J 37/32944* (2013.01)
(58) Field of Classification Search
USPC ............................ 118/723 MW; 156/245.41
See application file for complete search history.

(56) References Cited

U.S. PATENT DOCUMENTS

| | | | |
|---|---|---|---|
| 5,911,852 A * | 6/1999 | Katayama | H01J 37/32192 118/723 ME |
| 6,953,908 B2 | 10/2005 | Ishii et al. | |
| 7,374,620 B2 | 5/2008 | Ohmi et al. | |
| 8,006,640 B2 | 8/2011 | Sasaki | |
| 2006/0213436 A1 | 9/2006 | Ohmi et al. | |
| 2007/0113788 A1 | 5/2007 | Nozawa et al. | |
| 2007/0264441 A1 | 11/2007 | Ishibashi et al. | |

(Continued)

FOREIGN PATENT DOCUMENTS

| JP | H07-029890 | 1/1995 |
|---|---|---|
| JP | 2001-185542 | 7/2001 |

(Continued)

*Primary Examiner* — Rakesh K Dhingra
(74) *Attorney, Agent, or Firm* — IPUSA, PLLC

(57) ABSTRACT

A plasma processing apparatus is provided that is configured to supply a gas into a chamber, generate a plasma from the gas using a power of an electromagnetic wave, and perform a predetermined plasma process on a substrate that is held by a mounting table. The plasma processing apparatus includes a dielectric window through which the electromagnetic wave that is output from an electromagnetic wave generator is propagated and transmitted into the chamber, a support member that supports the dielectric window, a partition member that separates a space where the support member is arranged from a plasma generation space and includes a protrusion abutting against the dielectric window, and a conductive member that is arranged between the partition member and the dielectric window and is protected from being exposed to the plasma generation space by the protrusion.

8 Claims, 8 Drawing Sheets

(56) References Cited

U.S. PATENT DOCUMENTS

| | | | |
|---|---|---|---|
| 2009/0050052 A1 | 2/2009 | Tian et al. | |
| 2011/0039417 A1* | 2/2011 | Matsumoto | H01J 37/32192 438/726 |
| 2012/0067845 A1* | 3/2012 | Monden | H01J 37/32192 216/69 |
| 2015/0371825 A1* | 12/2015 | Kobayashi | C23C 16/45565 156/345.34 |

FOREIGN PATENT DOCUMENTS

| | | |
|---|---|---|
| JP | 2005-268763 | 9/2005 |
| JP | 2007-184292 | 7/2007 |
| JP | 2007-188722 | 7/2007 |
| JP | 2007-214211 | 8/2007 |
| TW | 200522801 | 7/2005 |
| WO | 2007/091435 | 8/2007 |

\* cited by examiner

| CONDUCTIVE MEMBER MATERIAL | DISTANCE D OVER WHICH NO MULTIPACTOR DISCHARGE OCCURS [mm] | LINEAR EXPANSION COEFFICIENT [1/°C] | REQUIRED CLEARANCE [mm] | POWER LOSS [W] |
|---|---|---|---|---|
| Si | D<0.68 | 2.60E-06 | 0.25 | 100~1000 |
| SiO₂ (Quartz) | D<0.39 | 5.00E-07 | 0.39 | − |

|  | SYMBOL | VALUE | UNIT |
|---|---|---|---|
| EMISSION ENERGY | E0 | 1 | eV |
| MINIMUM ENERGY AT WHICH SECONDARY ELECTRON EMISSION COEFFICIENT BECOMES 1 | E1 | 40 | eV |
| NUMBER OF SECONDARY ELECTRON EMISSIONS | N | 1 | COUNT |
| DATA SAMPLING PERIOD | ΔD | 0.0025 | mm |
| HIGH FREQUENCY | f | 2.45 | GHz |

PLASMA PROCESSING APPARATUS

BACKGROUND OF THE INVENTION

1. Field of the Invention

The present invention relates to a plasma processing apparatus.

2. Description of the Related Art

Techniques are known for controlling the generation of plasma in a plasma processing apparatus that supplies a gas into a chamber, generates plasma from the gas using a high frequency power, and performs a predetermined plasma process on a substrate that is held by a mounting table.

For example, Japanese Laid-Open Patent Publication No. 2001-185542 (Patent Document 1) discloses an apparatus including a current path correction means for correcting a part of a high frequency current path that is formed by a high frequency bias applied to a wafer and is near an outer periphery of the wafer, wherein the current path part is forced toward an opposing electrode surface facing the wafer. As an example of the current path correction means, a conductive member is disposed near a wall at a lower part of a dielectric body.

However, according to Patent Document 1, the conductive member is configured to correct a current path in order to control a plasma generation region within the chamber and improve plasma processing in-plane uniformity of a wafer. On the other hand, Patent Document 1 does not contemplate measures for suppressing the occurrence of abnormal discharge within the chamber.

When abnormal discharge occurs within the chamber, the chamber may be damaged and particles may be generated from the chamber walls. The particles may be dispersed on a wafer while a plasma process is performed thereon, and short-circuits may occur in the wirings formed on the wafer, for example.

SUMMARY OF THE INVENTION

An aspect of the present invention is directed to suppressing the occurrence of abnormal discharge within the chamber of a plasma processing apparatus by suppressing the propagation of electromagnetic waves.

According to one embodiment of the present invention, a plasma processing apparatus is provided that is configured to supply a gas into a chamber, generate a plasma from the gas using a power of an electromagnetic wave, and perform a predetermined plasma process on a substrate that is held by a mounting table. The plasma processing apparatus includes a dielectric window through which the electromagnetic wave that is output from an electromagnetic wave generator is propagated and transmitted into the chamber, a support member that supports the dielectric window, a partition member that separates a space where the support member is arranged from a plasma generation space and includes a protrusion abutting against the dielectric window, and a conductive member that is arranged between the partition member and the dielectric window and is protected from being exposed to the plasma generation space by the protrusion.

DESCRIPTION OF THE PREFERRED EMBODIMENTS

In the following, embodiments of the present invention will be described with reference to the accompanying drawings. Note that in the following descriptions and drawings, elements having substantially the same features are given the same reference numbers and overlapping descriptions thereof may be omitted.

[Overall Configuration of Plasma Processing Apparatus]

Figure 1:
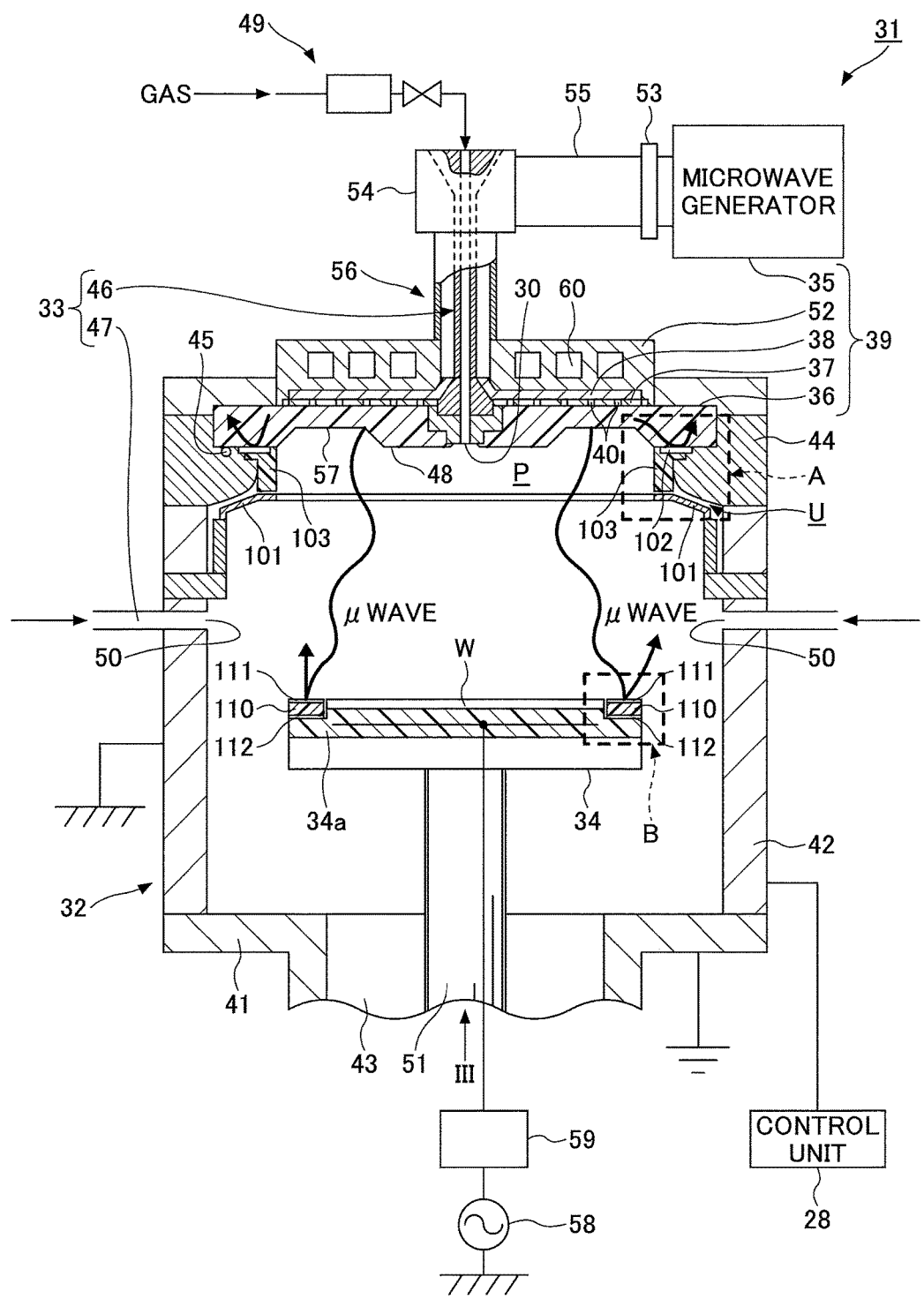
FIG. 1 is a longitudinal cross-sectional view of a plasma processing apparatus according to an embodiment of the present invention.

First, an overall configuration of a plasma processing apparatus 31 according to an embodiment of the present invention will be described with reference to FIG. 1. FIG. 1 is a cross-sectional view of the plasma processing apparatus 31 according to an embodiment of the present invention. In the present embodiment, a plasma processing apparatus using a radial line slot antenna is illustrated as an example of the plasma processing apparatus 31. Another example of the plasma processing apparatus 31 includes an electron cyclotron resonance (ECR) plasma apparatus. The plasma processing apparatus 31 may be any apparatus that supplies a gas into a chamber, generates a plasma from the gas using the power of electromagnetic waves, and performs a predetermined plasma process on a wafer W that is held by a mounting table 34.

The plasma processing apparatus 31 includes a chamber 32 for performing a plasma process such as etching on a semiconductor wafer (hereinafter also referred to as "wafer W") and a gas supply unit 33 for supplying gas into the chamber 32.

The plasma processing apparatus 31 also includes a plasma generating mechanism 39 for generating a plasma within the chamber 32 using microwaves, and a high frequency power source 58 for supplying high frequency power for applying an RF (radio frequency) bias to the wafer W that is held by the mounting table 34.

A ring-shaped focus ring 110 is arranged at the outer edge side of the mounting table 34. The front surface of the focus ring 110 is coated with a coating film 111. Further, the back surface of the focus ring 110 is coated with a coating film 112. Note that in embodiments of the present invention, at least one of the front surface and the back surface of the focus ring 110 is coated with a coating film.

The overall operations of the plasma processing apparatus 31 are controlled by a control unit 28. The control unit 28 may control overall operations of the plasma processing apparatus 31 by controlling the gas flow rate of the gas supply unit 33, the pressure in the chamber 32, and the high frequency power supplied to the mounting table 34, for example.

The chamber 32 may be made of aluminum (Al) that has been alumite-treated (anodized), for example. The chamber 32 is connected to ground. The chamber 32 includes a bottom part 41 that is disposed at the lower side of the mounting table 34, and a side wall 42 extending upwardly from the outer periphery of the bottom part 41. The sidewall 42 is cylindrical. An exhaust hole 43 that penetrates through a portion of the bottom part 41 is arranged at the bottom part 41 of the chamber 32.

Figure 3A:
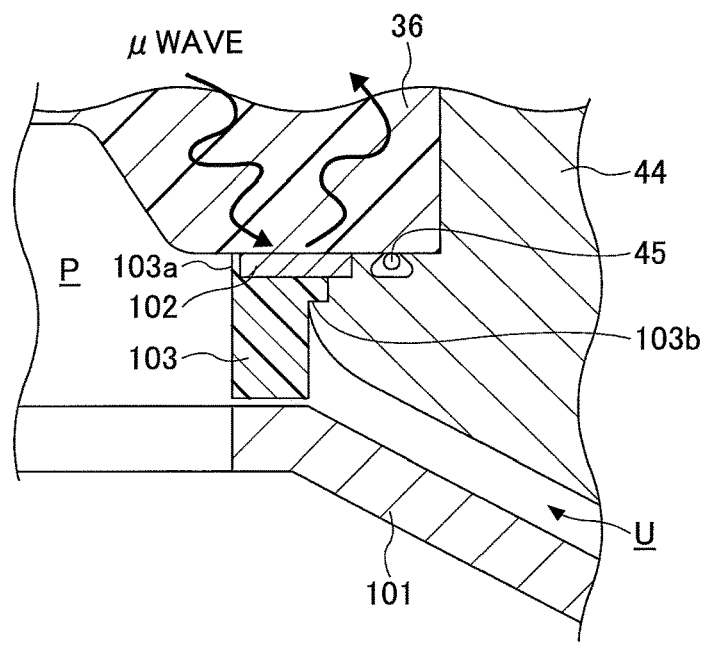
FIGS. 3A and 3B illustrate an exemplary configuration of an outer edge portion of a dielectric window according to an embodiment of the present invention.

The upper side of the chamber 32 is open. As illustrated in FIG. 1 and FIG. 3A, which is an enlarged view of a region A of FIG. 1, the opening of the chamber 32 is sealed by a support member 44, a dielectric window 36, and an O-ring 45. The support member 44 is arranged on an upper portion of the side wall 42 of the chamber 32. The dielectric window 36 is arranged at a ceiling portion of the chamber 32, and the O-ring 45 is a sealing member that is interposed between the dielectric window 36 and the support member 44.

The outer edge of the dielectric window 36 is supported by the support member 44. The support member 44 is made of a metal such as aluminum. The support member 44 constitutes a part of a lid of the upper opening of the chamber 32.

A metal plate 102 and a partition member 103 are arranged at the lower side of an outer edge portion of the dielectric window 36. The partition member 103 is made of a dielectric material such as quartz and is supported by the dielectric window 36 (or the inner wall of the chamber 32). An installation member 101 is arranged to extend below the support member 44. The installation member 101 acts as a receiving member for receiving particles that may be generated within a space U where the support member 44 is arranged and thereby prevents the particles from being scattered into a plasma generation space P. Note that a small space is provided between the partition member 103 and the installation member 101.

Referring back to FIG. 1, the gas supply unit 33 includes a first gas supply unit 46 for introducing a gas toward the center of the wafer W, and a second gas supply unit 47 for introducing a gas to the outer side of the wafer W. The first gas supply unit 46 includes a gas supply hole 30 that is provided at a position recessed from a lower face 48 of the dielectric window 36. The first gas supply unit 46 supplies a gas for plasma excitation from the gas supply hole 30 while adjusting the flow rate of the gas by a gas supply system 49 that is connected to the first gas supply unit 46. The second gas supply unit 47 includes a plurality of gas supply holes 50 that are arranged at an upper side portion of the side wall 42 for supplying a gas for plasma excitation into the chamber 32. The gas supply holes 50 are arranged at equal intervals around the circumferential direction of the chamber 32.

The mounting table 34 includes an electrode to which a high frequency power for biasing is applied from a high frequency power source 58 via a matching unit 59. The high frequency power source 58 may be capable of outputting a high frequency of 13.56 MHz at a predetermined power (biasing power), for example. The matching unit 59 accommodates a matching box (not shown) for matching the impedance at the high frequency power source 58 and the impedance at the plasma side (load side). The matching box includes a blocking capacitor (not shown) for generating a self-biasing voltage.

An electrostatic chuck 34a is arranged on the mounting table 34. The electrostatic chuck 34a is capable of electrostatically attracting the wafer W. Note that in some embodiments, the electrostatic chuck 34a does not have to be provided on the mounting table 34. In this case, the wafer W may be held directly by the mounting table 34, for example.

The mounting table 34 is supported by an insulating cylindrical support 51 that extends vertically upward from the lower side of the bottom part 41. The exhaust hole 43 is arranged to penetrate through a portion of the bottom part 41 of the chamber 32 along the outer periphery of the cylindrical support 51. An exhaust system (not shown) is connected to the bottom side of the exhaust hole 43 via an exhaust pipe. The exhaust system includes a vacuum pump such as a turbo molecular pump (not shown). The exhaust system is capable of reducing the pressure within the chamber 32 to a predetermined pressure.

The plasma generating mechanism 39 is provided outside the chamber 32 and includes a microwave generator 35 for generating microwaves for plasma excitation. The microwave generator 35 is an example of an electromagnetic wave generator, and the microwave output by the microwave generator 35 is an example of an electromagnetic wave.

Also, the plasma generating mechanism 39 includes the dielectric window 36 that is disposed at a position facing the mounting table 34. Microwaves output by the microwave generator 35 are propagated by the dielectric window 36 and transmitted into the chamber 32. The plasma generating mechanism 39 also includes a slot antenna 37 that is arranged on the upper side of the dielectric window 36. The slot antenna 37 includes a plurality of slots for radiating microwaves to the dielectric window 36. Also, the plasma generating mechanism 39 may include a dielectric member 38 that is arranged on the upper side of the slot antenna 37 and is configured to propagate microwaves introduced from a coaxial waveguide 56 (described below) in the radial direction.

The microwave generator 35 includes a matching circuit 53 and is connected to the coaxial waveguide 56 via a mode transducer 54 and a waveguide 55. For example, microwaves in the TE mode that are generated by the microwave generator 35 may pass through the waveguide 55 to be converted into the TEM mode by the mode converter 54 and propagated through the coaxial waveguide 56. The frequency of the microwaves to be generated by the microwave generator 35 may be set to 2.45 GHz, for example.

The dielectric window 36 is substantially disc-shaped and may be made of a dielectric material such as quartz or alumina. An annular concave part 57 is provided at a portion of the lower face 48 of the dielectric window 36. The concave part 57 has tapered side walls in order to facilitate the generation of standing waves with the introduced microwaves. By arranging the concave part 57, a plasma may be efficiently generated by microwaves at the lower side of the dielectric window 36.

Figure 2:
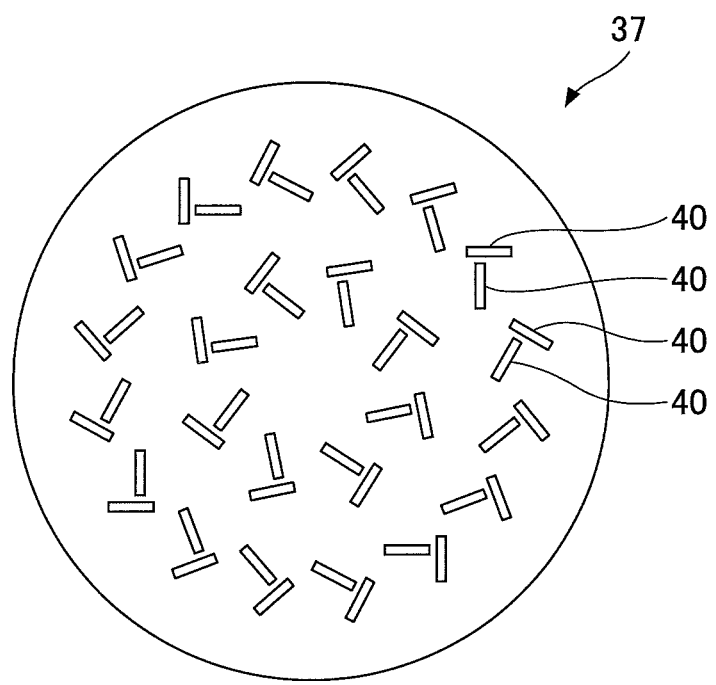
FIG. 2 illustrates an example of a slot antenna plate according to an embodiment of the present invention.

The slot antenna 37 is a thin plate having a circular shape. As illustrated in FIG. 2, the plurality of slots 40 are arranged into pairs, and the slots 40 of each pair are set apart by a predetermined interval and are orthogonal to each other. The pairs of the slots 40 are arranged at predetermined intervals along the circumferential direction. The pairs of the slots 40 are also arranged at predetermined intervals along the radial direction.

Referring back to FIG. 1, the microwaves generated by the microwave generator 35 are propagated through the coaxial waveguide 56. The microwaves are spread radially outward within a region between a cooling jacket 52 and the slot antenna 37 and are radiated to the dielectric window 36 from the plurality of slots 40 arranged in the slot antenna 37. The microwaves transmitted through the dielectric window 36 generate an electric field directly below the dielectric window 36 and cause the generation of a plasma within the chamber 32. Note that a circulation path 60 for circulating a coolant is formed within the cooling jacket 52.

When a plasma is generated in the plasma processing apparatus 31, a plasma generation space is created just below the lower face 48 of the dielectric window 36, more specifically, in a region located several centimeters below the lower face 48 of the dielectric window 36. Also, a so-called plasma diffusion area where the plasma generated at the plasma generation space is diffused is created in a region located vertically below the plasma generation space. In the present embodiment, the plasma generation space P includes such a plasma diffusion area. The plasma generation space P is distinguished and separated from the space U where the support member 44 is arranged by the partition member 103.

The control unit 28 includes a CPU (Central Processing Unit), a ROM (Read Only Memory), and a RAM (Random Access Memory), and is configured to control plasma processing such as etching according to predetermined procedures set up in a recipe that is stored in the RAM, for example. Note that the functions of the control unit 28 may be implemented using software, hardware, or a combination thereof.

When performing a predetermined plasma process such as etching in the plasma processing apparatus 31 having the above configuration, first, the wafer W is transferred into the chamber 32 and is held on the electrostatic chuck 34a that is arranged on the mounting table 34. Then, a plasma is generated from a gas using high frequency power, and a plasma process such as etching is performed on the wafer W with the generated plasma. After the plasma process is completed, the wafer W is unloaded from the chamber 32.

[Configuration for Suppressing Abnormal Discharge at Outer Edge of Dielectric Window]

Figure 3B:
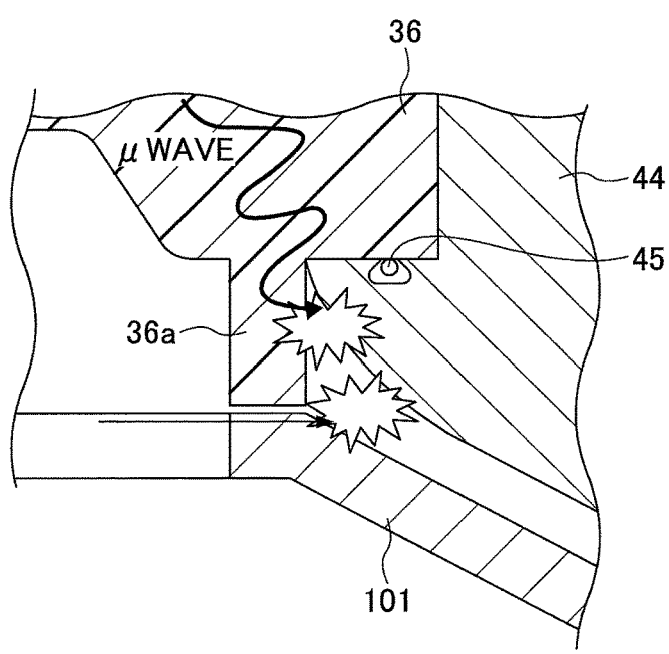

In the following, a configuration for suppressing abnormal discharge at the outer edge of the dielectric window 36 is described with reference to FIGS. 3A and 3B. FIG. 3A illustrates an exemplary configuration of an outer edge portion of the dielectric window 36 of the plasma processing apparatus 31 according to the present embodiment. FIG. 3B illustrates a comparative example of the dielectric window 36 of the plasma processing apparatus 31.

As illustrated in FIG. 3A, the metal plate 102 and the partition member 103 are arranged at a lower portion of the outer edge of the dielectric window 36. The upper face of the metal plate 102 comes into contact with the lower face of the dielectric window 36, and the lower face of the metal plate 102 comes into contact with the upper face of the partition member 103. In this way, the metal plate 102 can reflect microwaves transmitted through the dielectric window 36.

The partition member 103 separates the plasma generation space P from the space U where the support member 44 is arranged. The partition member 103 includes a protrusion 103a. The protrusion 103a covers the inner diameter side of the metal plate 102 so as not to expose the metal plate 102 to the plasma generation space P, and has an upper portion abutting against the dielectric window 36. Note that in some embodiments, the partition member 103 may be integrally formed with the dielectric window 36 via the protrusion 103a. In such a case, the metal plate 102 may be inserted between the dielectric window 36 and the partition member 103 to abut against the protrusion 103a.

In FIG. 3B, the metal plate 102 is not provided, and as such, microwaves output from the microwave generator 35 are transmitted through the dielectric window 36 and are supplied not only to the plasma generating space P but also to the space U where the support member 44 is arranged. As a result, abnormal discharge occurs in a gap between the support member 44 and a partition part 36a of the dielectric window 36. Also, the microwaves propagate through a gap between the installation member 101 and the partition part 36a and enter the space U where the support member 44 is arranged to thereby cause abnormal discharge in the space U where the support member 44 is arranged. When abnormal discharge occurs in the chamber 32, the chamber 32 may be damaged, and particles of yttria and aluminum may be generated from the wall surface of the chamber 32 causing metal contamination within the chamber 32. Particles generated in the space U may be scattered into the plasma generation space P, and when the particles reach the wafer W during a plasma process, they may affect the wafer W by causing short-circuits in the wirings formed on the wafer W, for example. This may lead to a decrease in yield, for example.

On the other hand, in the present embodiment, the metal plate 102 is arranged between the plasma generation space P and the space U where the support member 44 is arranged as illustrated in FIG. 3A. Thus, microwaves propagating through the dielectric window 36 are reflected by the metal plate 102 to be prevented from passing through the partition member 103. In this way, microwaves may be prevented from entering the space U from the dielectric window 36 and/or entering the space U through the lower portion of the partition member 103, and the occurrence of abnormal discharge in the space U where the support member 44 is arranged may be suppressed. As a result, damage to the chamber 32 and parts within the chamber 32 may be prevented. In this way, a decrease in yield may be prevented, and the product life of the chamber 32 and parts within the chamber 32 may be enhanced.

In the present embodiment, the metal plate 102 is made of aluminum. The metal plate 102 is an example of a conductive member arranged between the partition member 103 and the dielectric window 36. The conductive member that is disposed between the partition member 103 and the dielectric window 36 may be a metallic conductive member or a non-metallic conductive member. Examples of metals that may be used as the metallic conductive member include aluminum and the like. Examples of materials that may be used as the non-metallic conductive member include silicon (Si), germanium (Ge), silicon carbide (SiC), and conductive plastics. The conductive member may be formed by thermal spraying. For example, the conductive member may be a sprayed film formed by coating a conductive material such as silicon or aluminum on the dielectric window 36 by thermal spraying. In the present embodiment, aluminum is sprayed on the dielectric window 36 to form a thin and uniform metal plate 102.

Also, the metal plate 102 is arranged to be protected from being exposed to the plasma generation space P by the protrusion 103a that is formed into a ring-shape extending along the plasma generation space P side of the partition member 103. When the metal plate 102 is exposed to the plasma generation space P, dust from the metal plate 102 may cause contamination within the chamber 32. Thus, in the present embodiment, the protrusion 103a is arranged at the partition member 103 to thereby prevent the metal plate 102 from being directly exposed to the plasma generation space P, and in this way, metal contamination within the chamber 32 may be prevented.

The metal plate 102 is arranged to be in contact with the support member 44. Thus, the metal plate 102 is connected to ground via the support member 44 and the chamber 32. As a result, a charge held by the metal plate 102 may be flown toward the ground side, and a potential difference between the metal plate 102 and the support member 44 may be set to 0 such that the occurrence of a DC discharge may be prevented. Note, however, that the metal plate 102 does not necessarily have to be connected to ground.

The partition member 103 is L-shaped and is arranged to hold the metal plate 102 while being supported by the dielectric window 36 (or the inner wall of the chamber 32). An inner corner 103b of the partition member 103 is arranged to be close to the metal plate 102. Note that abnormal discharge is more likely to occur at pointed portions. Thus, the inner corner 103b of the partition member 103 is brought close to the lower face of the metal plate 102. Because microwaves are reflected by the metal plate 102, an electric field at the inner corner 103b of the partition member 103 may be weakened. In this way, the occurrence of abnormal discharge due to electric field concentration at the inner corner 103b of the partition member 103 may be suppressed.

The surface of the support member 44 may be coated with a quartz coating film, for example. In this way, the occurrence of abnormal discharge in the space U may be further suppressed.

[Multipactor Discharge]

Figure 4:
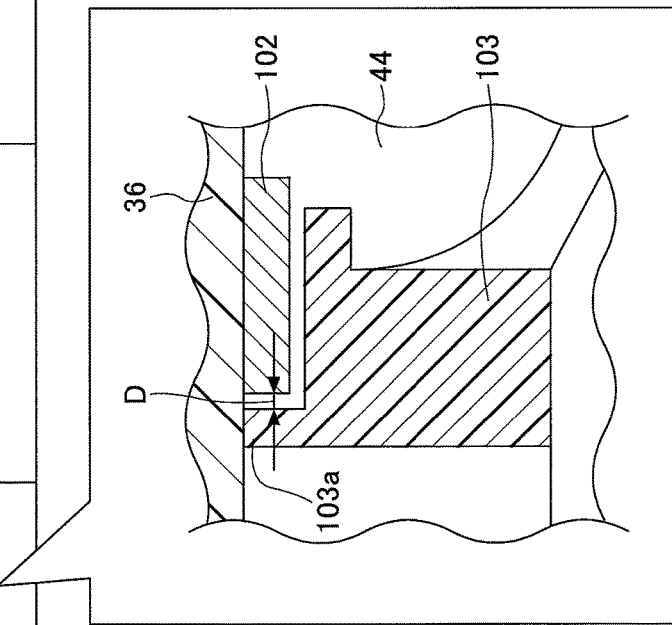
FIG. 4 is a table indicating characteristics including a multipactor distance of a metal plate according to an embodiment of the present invention.

As illustrated in the lower part of FIG. 4, a distance D of the gap between the protrusion 103a and the metal plate 102 (conductive member) is designed to be a distance over which multipactor discharge would not occur. Here, multipactor discharge refers to an electron avalanche phenomenon that is caused by repeated secondary electron emissions.

The table of FIG. 4 indicates calculations of the distance D of the gap between the dielectric window 36 made of quartz and the conductive member over which multipactor discharge would not occur.

When silicon (Si) is used as the material of the conductive member, the distance D over which multipactor discharge would not occur is less than 0.68 mm, meaning the gap between the protrusion 103a and the conductive member has to be no more than 0.68 mm. When quartz (SiO2) is used as the material of the conductive member, the distance D over which multipactor discharge would not occur is less than 0.39 mm, meaning the gap has to be even smaller.

Based on the above, silicon may preferably be used over quartz as the material of the conductive member. Also, when the conductive member is made of silicon, the power loss of microwaves in the conductive member may be greater as compared to that in the metal plate 102 made of aluminum. This suggests that the microwaves may be absorbed by the silicon of the conductive member.

[Principle of Multipactor Discharge]

In the following, the principle of multipactor discharge will be described with reference to FIGS. 5A-5D. As described above, multipactor discharge is caused by the repetition of secondary electron emissions.

(Condition for Repeated Secondary Electron Emissions)

Figure 5A:
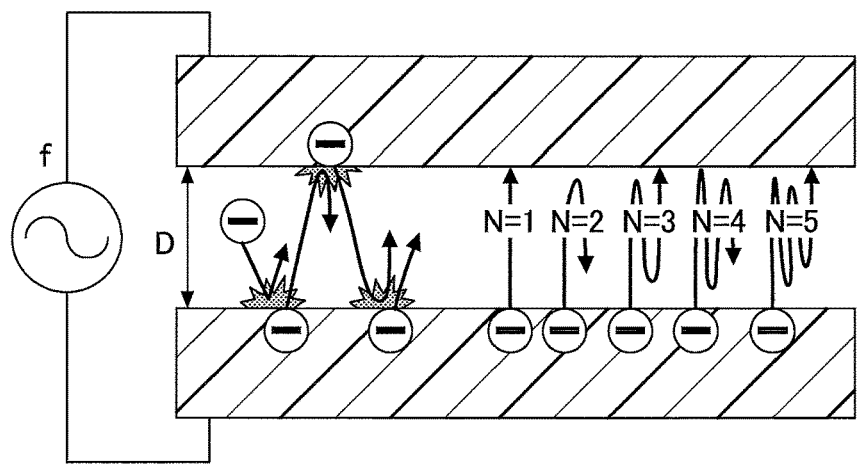
FIGS. 5A-5D illustrate an exemplary relationship between the number of secondary electron emissions and a multipactor discharge region according to an embodiment of the present invention.

For example, as illustrated in FIG. 5A, dielectric plates forming a pair of electrodes facing each other may be spaced apart by the distance D, and an electromagnetic wave of a frequency f (high frequency wave or microwave) may be applied between the electrodes. A secondary electron emitted from one electrode surface is incident on the other electrode surface without colliding with ions in the space between the electrodes. Such secondary electron emissions occur repeatedly, and electron discharge (multipactor discharge) occurs as a result of the repetition of the secondary electron emissions.

Assuming an electric field of V×sin(2πft+θ) is applied between the electrodes, the following formula (1) is satisfied.

$$m\frac{d^2x}{dt^2} = \frac{-eV}{D}\sin(2\pi ft + \theta) \qquad (1)$$

In the above formula (1), "t" represents the time, and "x" represents the distance between the electrodes.

By integrating the above formula (1), the following formula (2) may be obtained.

$$m\frac{dx}{dt} = \frac{eV}{D}\frac{\cos(2\pi ft + \theta)}{2\pi f} + A \qquad (2)$$

Further, by integrating the above formula (2), the following formula (3) may be obtained.

$$mx = \frac{eV}{D}\frac{\sin(2\pi ft + \theta)}{(2\pi f)^2} + At + B \qquad (3)$$

Assuming x=0 and dx/dt=0 when t=0, and x=D when t=NT/2, by applying the above conditions to formula (3), the following formula (4) may be obtained.

$$V = \frac{(fD)^2}{N\pi} \cdot \frac{-m}{e\cos(\theta)} \qquad (4)$$

Here, N represents the number of secondary electron emissions. For example, as illustrated in FIG. 5A, when an electron is incident on one of the opposing faces of the electrodes and causes a secondary electron emission, the number N of secondary electron emissions is equal to "1". When the electron is further incident on the other one of the opposing faces of the electrodes to cause a further secondary electron emission, the number N of the secondary electron emissions is equal to "2". For example, if the electron is incident five times on the opposing faces of the electrodes, the number N of the secondary electron emission is equal to "5". The present calculation is performed assuming an electron reaches an opposing electrode face in N/2 (odd number) cycles. That is, the calculation is performed assuming x=D when t=(N/2)×T cycles.

In order to prompt the repetition of secondary electron emissions, microwaves have to work on the electric field between the electrodes in a timely manner. That is, in the above formula (4), the electric field V between the electrodes is a function of fD (where "f" is the frequency of the microwave and "D" is the distance between the electrodes).

Figure 5B:
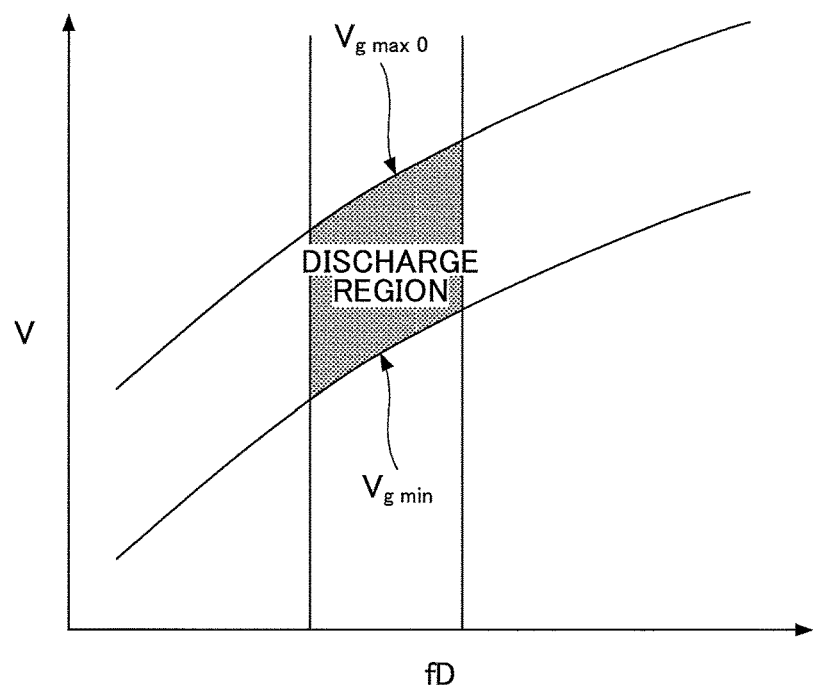

FIG. 5B is a graph representing fD on the horizontal axis and the electric field V between the electrodes on the vertical axis. As a condition for repeating secondary electron emissions within the possible value range of the product of the frequency f of the microwave and the distance D between the electrodes in the graph of FIG. 5B, the electric field V has to be maintained between a maximum value $V_{g\ max\ 0}$ of the electric field and a minimum value $V_{g\ min}$ of the electric field calculated from formula (4). Thus, within the possible value range of fD shown in FIG. 5B, a discharge region corresponds to a region defined by the maximum value of $V_{g\ max\ 0}$ of the electric field and the minimum value $V_{g\ min}$ of the electric field.

The maximum value $V_{g\ max\ 0}$ of the electric field calculated from formula (4) may be defined by the following formula (5). The minimum value $V_{g\ min}$ of the electric field calculated from formula (4) may be defined by the following formula (6).

$$V_{gmax0} = \frac{22480}{N\pi}(fD)^2 \tag{5}$$

$$V_{gmin} = \frac{22480(fD)^2 - (N\pi fD)\sqrt{44960E_0}}{\sqrt{(N\pi)^2 + 4}} \tag{6}$$

Here, "$E_0$" represents the emission energy.

Figures 5C, 5D:
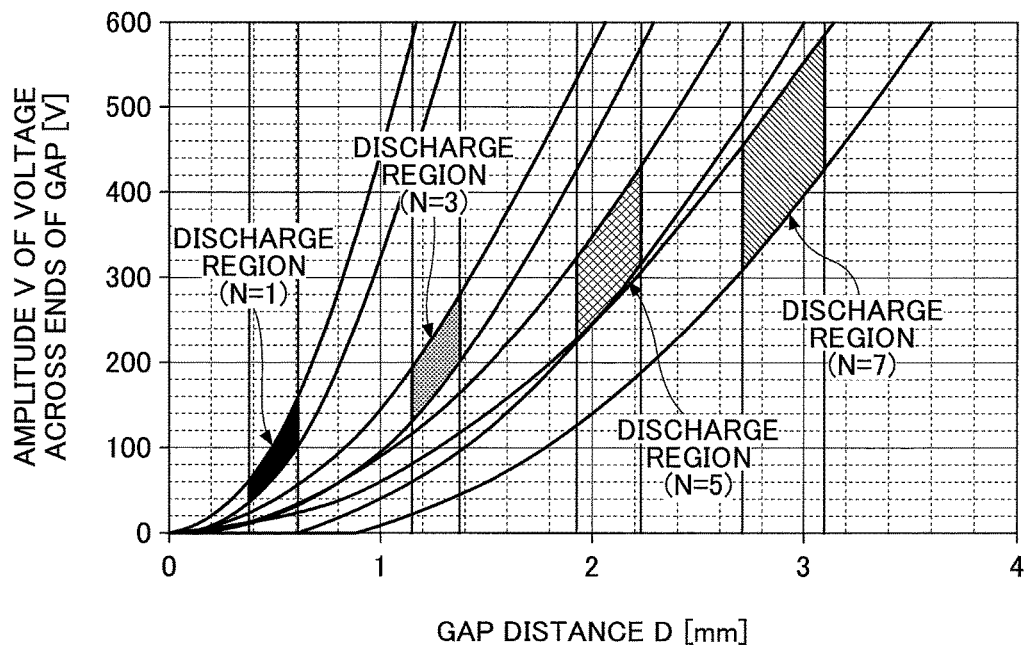

As shown in FIG. 5C, in the present example, the emission energy $E_0$ is set to 1 eV, an oscillation period of an electron before hitting a wall as a data sampling period $\Delta D$ is set to 0.0025 mm, and the frequency f of the high frequency wave is set to 2.45 GHz.

FIG. 5D is a graph showing the multipactor discharge regions when the number N of the secondary electron emissions is equal to 1, 3, 5, and 7 calculated from the above formulas (5) and (6). As can be appreciated from FIG. 5D, the amplitude V of the voltage across the opposing faces of the electrodes increases as the number (odd number) N of secondary electron emissions increases. According to these calculation results, in a case where multipactor discharge is the dominant discharge occurring between electrodes having a gap (distance D) of 2.5 mm, the amplitude V of the voltage across the opposing faces may be estimated to be about 400 V.

(Occurrence Condition for Secondary Electron Emission)

In the following, an occurrence condition for secondary electron emission will be described. By applying the condition dx/dt=0 when t=0 to formula (2), the following formulas (7) and (8) may be obtained.

$$m\frac{dx}{dt} = \frac{eV}{2\pi mfD}(\cos\theta - \cos(\omega t + \theta)) \tag{7}$$

$$E_{max} = \frac{1}{2}m\left(\frac{dx}{dt}\right)^2 = \frac{e^2V^2}{2m\pi(fD)^2} \tag{8}$$

In this case, by substituting the amplitude V of the voltage across the electrodes with the maximum value $V_{g\ max\ 0}$ of the amplitude of the voltage ($V=V_{g\ max\ 0}$) into formula (5), the following formulas (9) and (10) are satisfied when the minimum emission energy $E_1$ at which the secondary electron emission coefficient becomes 1 is less than or equal to the maximum value $E_{max}$ of the emission energy ($E_1 \leq E_{max}$). Here, the emission energy $E_1$ is the energy at which the number of incident electrons and the number of secondary electrons that are emitted are equal which corresponds to the minimum energy that can cause multipactor discharge.

$$\frac{\sqrt{2m}\pi^2}{2248e}N\sqrt{\frac{E_1}{100}} < fD \tag{9}$$

$$0.15 \cdot N\sqrt{\frac{E_1}{100}} < fD < 0.17\left(N + \frac{4}{N\pi^2}\right)\sqrt{\frac{E_1}{100}} \tag{10}$$

Multipactor discharge occurs only in a region where the secondary electron emission coefficient is greater than 1. When the space (gap) between opposing members is too small, acceleration of the electrons by the electric field may be inadequate such that multipactor discharge would not occur. Thus, the distance between members abutting against the dielectric window 36 through which microwaves are transmitted is preferably arranged to be as small as possible.

Figure 6A:
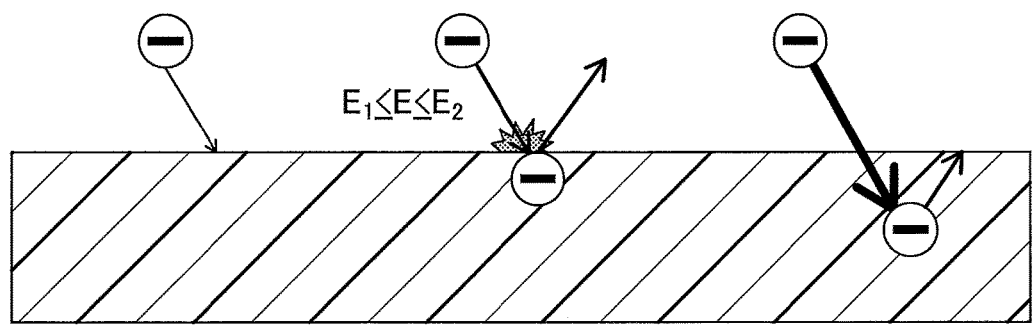
FIGS. 6A and 6B illustrate an occurrence condition of secondary electron emissions according to an embodiment of the present invention.
Figure 6B:
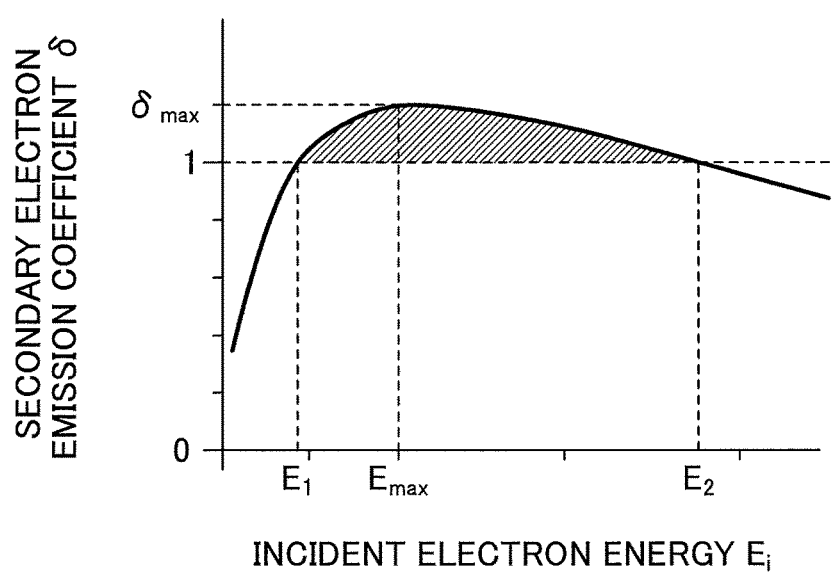

As shown in FIGS. 6A and 6B, provided emission energy $E_1$ and emission energy $E_2$ represent energies at which the secondary electron emission coefficient δ is equal to 1, and $E_1 \leq E \leq E_2$, multipactor discharge would not occur if the secondary electron emission coefficient δ for the emission energy E is less than or equal to 1. That is, multipactor discharge would not occur if the maximum value $E_{max}$ of the emission energy E that satisfies the condition $E_1 \leq E \leq E_2$ as illustrated in FIG. 6B is less than or equal to 1.

The secondary electron emission coefficient δ is determined by the material of the electrodes. For example, if the electrodes are made of aluminum, the maximum value $\delta_{max}$ of the secondary electron emission coefficient is 1, and the maximum value $E_{max}$ of the emission energy is 300 eV, which is equal to the emission energy $E_1=300$ eV and the emission energy $E_2=300$ eV. According to the above, when the opposing electrodes are made of aluminum, the secondary electron emission coefficient δ is less than or equal to 1 regardless of the incident energy E of the electrons, and as such, multipactor discharge would not occur.

It can be appreciated that multipactor discharge is less likely to occur when the secondary electron emission coefficient δ approximates 1.

On the other hand, for example, when the opposing electrodes are made of quartz, the maximum value $\delta_{max}$ of the secondary electron emission coefficient may be from 2.1 to 4, and the maximum value $E_{max}$ of the emission energy is 400 eV. Thus, multipactor discharge is more likely to occur when the electrodes are made of quartz as compared to a case where the electrodes are made of aluminum or silicon.

[Configuration for Suppressing Abnormal Discharge at Focus Ring]

Figure 7:
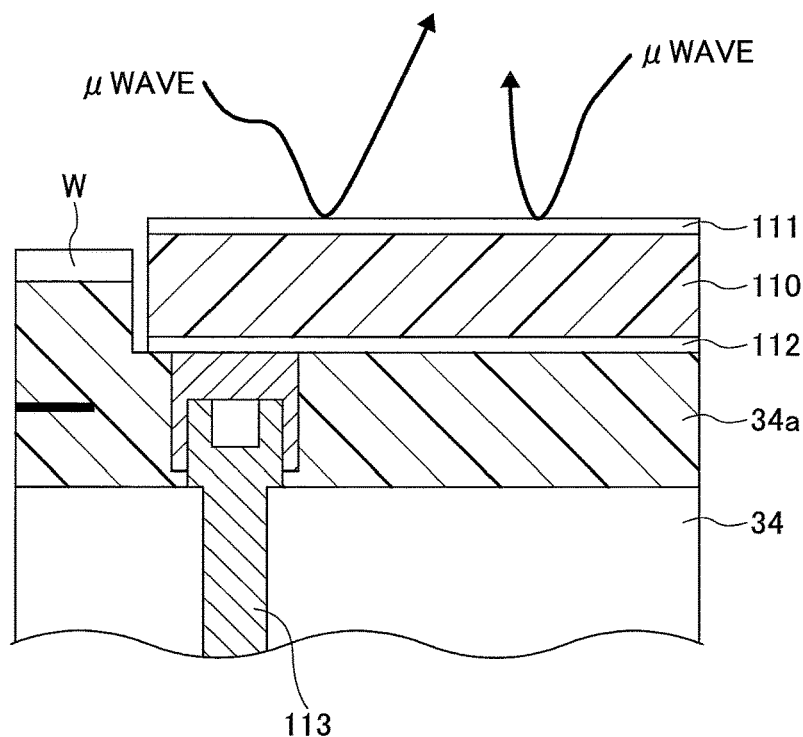
FIG. 7 illustrates an exemplary configuration of a focus ring according to an embodiment of the present invention.
Figure 8:
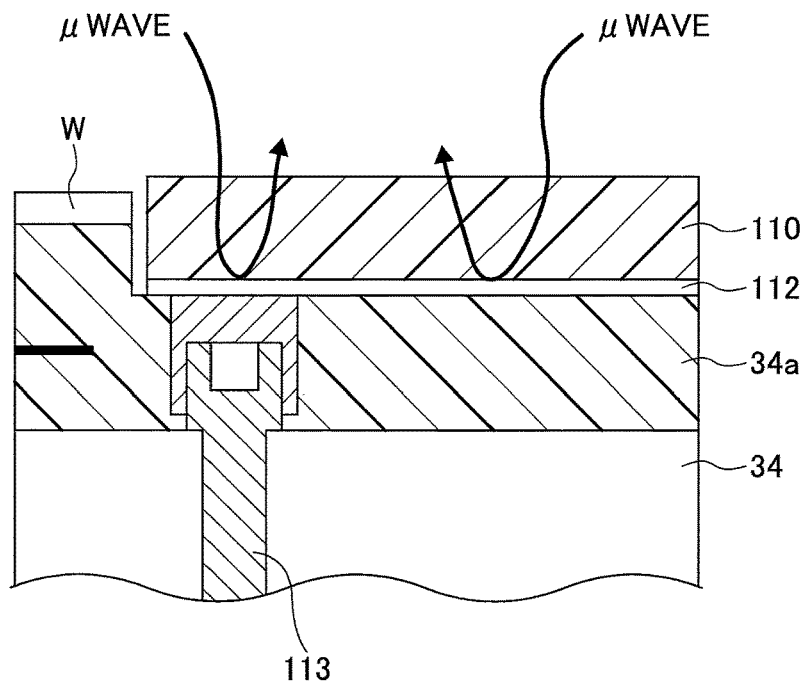
FIG. 8 illustrates another exemplary configuration of a focus ring according to an embodiment of the present invention.

In the following, a configuration for suppressing abnormal discharge at the focus ring 110 will be described with reference to FIGS. 7 and 8. FIG. 7 is an enlarged view of a region B of FIG. 1 illustrating an exemplary configuration of the focus ring 110. FIG. 8 is an enlarged view of the region B illustrating another exemplary configuration of the focus ring 110.

In the plasma processing apparatus 31 that generates a plasma using microwaves, the microwaves are propagated up to the vicinity of a boundary between the focus ring 110 and the electrostatic chuck 34a on the mounting table 34. As a result, abnormal discharge may occur at a gap between the focus ring 110 and the electrostatic chuck 34a, and the plasma processing apparatus 31 may be damaged. For example, particles may be generated, and the product life of the parts within the plasma processing apparatus 31 may be reduced. Thus, the occurrence of abnormal discharge in the gap between the electrostatic chuck 34a and the focus ring 110 is preferably suppressed along with the suppression of abnormal discharge at the outer edge of the dielectric window 36 as described above.

In one preferred embodiment, the front surface and the back surface of the focus ring 110 may respectively be coated with the coating film 111 and the coating film 112 as illustrated in FIG. 7. In another embodiment, only the back surface of the focus ring 110 may be coated with the coating film 112 as illustrated in FIG. 8. In another embodiment, only the front surface of the focus ring 110 may be coated with the coating film 111, for example. Also, in some embodiments, in addition to coating at least one of the front surface and the back surface of the focus ring 110, one or more side faces of the focus ring 110 may be coated with a coating film.

Metallic conductive members or non-metallic conductive members may be used as the coating films 111 and 112. For example, a metal such as aluminum may be used as the metallic conductive member. Also, materials such as silicon (Si), germanium (Ge), silicon carbide (SiC), and conductive plastics may be used as the non-metallic conductive member. The coating films 111 and 112 may be formed by thermal spraying. For example, the coating films 111 and 112 may be sprayed films formed by coating aluminum or silicon on the focus ring 110 by thermal spraying. In the present embodiment, aluminum is sprayed on the focus ring 110 to form thin and uniform coating films 111 and 112.

In this way, microwaves may be reflected by the coating films 111 and 112, and propagation of the microwaves into the gap between the electrostatic chuck 34a and the focus ring 110 may be prevented. In turn, the occurrence of abnormal discharge in the gap between the electrostatic chuck 34a and the focus ring 110 may be suppressed. As a result, metal contamination within the chamber 32 caused by the generation of particles at the back surface of the focus ring 110 may be prevented. Also, the product life of the parts within the chamber 32 may be prolonged.

Further, as illustrated in FIGS. 7 and 8, a screw 113 for fixing the electrostatic chuck 34a on the mounting table 34 may be formed by a conductive member such as a metal, and the screw 113 may be connected to the chamber 32. In this way, the coating film 112 may be connected to ground via the screw 113 and the chamber 32. As a result, an electric charge held by the coating film 112 may be flown toward the ground side, and the potential difference between the coating film 112 and the electrostatic chuck 34a may be set to 0 to prevent the occurrence of a DC discharge. Note, however, that the coating film 112 does not necessarily have to be connected to ground.

As described above, in the plasma processing apparatus 31 according to the present embodiment, microwaves may be reflected by the ring-shaped metal plate 102 arranged at the lower side of the outer edge portion of the dielectric window 36. As a result, the occurrence of abnormal discharge in the vicinity of the outer edge of the dielectric window 36 may be prevented.

Further, in the plasma processing apparatus 31 according to the present embodiment, microwaves may be reflected by at least one of the coating film 111 arranged on the front surface of the focus ring 110 and the coating film 112 arranged on the back surface of the focus ring 110. In this way, the occurrence of abnormal discharge in the gap between the focus ring 110 and the electrostatic chuck 34a may be prevented.

Although illustrative embodiments of the plasma processing apparatus according to the present invention have been described above, a plasma processing apparatus according to the present invention is not limited to the above embodiments, and numerous variations and modifications may be made within the scope of the present invention. Also, two or more of the embodiments described above may be combined to the extent practicable.

For example, the plasma processing apparatus according to the present invention may include the metal plate 102 arranged on the dielectric window 36 as well as the coating film 111 arranged on the front surface of the focus ring 110 and/or the coating film 112 arranged on the back surface of the focus ring 110. In other examples the plasma processing apparatus according to the present invention may only include the metal plate 102 or the coating film 111 and/or the coating film 112.

Also, the substrate to be processed by the plasma processing apparatus according to the present invention is not limited to a semiconductor wafer. For example, the substrate may be a large-size substrate for a flat panel display, or a substrate for an EL (electroluminescence) element or a solar cell.

The present application is based on and claims priority to Japanese Patent Application No. 2014-218625 filed on Oct. 27, 2014, the entire contents of which are hereby incorporated by reference.

What is claimed is:

1. A plasma processing apparatus configured to supply a gas into a chamber, generate a plasma from the gas using a power of an electromagnetic wave, and perform a predetermined plasma process on a substrate that is held by a mounting table, the plasma processing apparatus comprising:
   a chamber in which plasma is generated;
   a dielectric window through which the electromagnetic wave that is output from an electromagnetic wave generator is propagated and transmitted into the chamber;
   a support that supports the dielectric window;
   a partition arranged below the dielectric window, the partition separating a space where the support is arranged from a plasma generation space in the chamber, and including a protrusion abutting against the dielectric window; and
   a conductive ring formed of silicon that is arranged between the partition and the dielectric window, and an inner diameter side of the conductive ring is covered by the protrusion to protect the conductive ring from being exposed to the plasma generation space, wherein a gap between the protrusion and the conductive plate is arranged to have a distance of less than 0.68 mm.

2. The plasma processing apparatus according to claim 1, wherein the partition member is L-shaped, and an inner corner of the L-shaped partition member is arranged to be close to the conductive ring.

3. The plasma processing apparatus according to claim 1, further comprising:
   an installation ring that is arranged to extend below the support, and a gap is provided between the partition and the installation ring.

4. The plasma processing apparatus according to claim 1, wherein the conductive ring is connected to ground.

5. The plasma processing apparatus according to claim 1, further comprising:
   a focus ring that is arranged at an outer edge side of the mounting table; and
   a conductive film that is arranged on at least one of a front surface or a back surface of the focus ring.

6. The plasma processing apparatus according to claim 5, wherein the conductive film is connected to ground.

7. The plasma processing apparatus according to claim 1, wherein the gap is provided in a ring-shape, and is positioned between the protrusion of the partition and a plasma generation space side of the conductive ring.

8. A plasma processing apparatus configured to supply a gas into a chamber, generate a plasma from the gas using a power of an electromagnetic wave, and perform a predetermined plasma process on a substrate that is held by a mounting table, the plasma processing apparatus comprising:
- a chamber in which plasma is generated;
- a dielectric window through which the electromagnetic wave that is output from an electromagnetic wave generator is propagated and transmitted into the chamber;
- a support that supports the dielectric window;
- a partition arranged below the dielectric window, the partition separating a space where the support is arranged from a plasma generation space in the chamber, and including a protrusion abutting against the dielectric window; and
- a conductive ring formed of SiO2 that is arranged between the partition and the dielectric window and is protected from being exposed to the plasma generation space by the protrusion wherein a gap between the protrusion and the conductive ring is arranged to have a distance less than 0.39 mm.

* * * * *